United States Patent [19]
Joannopoulos et al.

[11] Patent Number: 5,955,749
[45] Date of Patent: Sep. 21, 1999

[54] LIGHT EMITTING DEVICE UTILIZING A PERIODIC DIELECTRIC STRUCTURE

[75] Inventors: John D. Joannopoulos, Belmont; Shanhui Fan, Somerville; Pierre R. Villeneuve, Boston; E. Frederick Schubert, Canton, all of Mass.

[73] Assignees: Massachusetts Institute of Technology, Cambridge, Mass.; Trustees of Boston University, Boston, Mass.

[21] Appl. No.: 08/758,955

[22] Filed: Dec. 2, 1996

[51] Int. Cl.$^6$ ...................................................... H01L 33/00
[52] U.S. Cl. .............................. 257/98; 257/94; 257/432; 372/101
[58] Field of Search ................................ 257/432, 98, 94; 372/101

[56] References Cited

U.S. PATENT DOCUMENTS

| | | | |
|---|---|---|---|
| 5,162,878 | 11/1992 | Sasagawa et al. | 257/98 |
| 5,264,715 | 11/1993 | Guenter et al. | 257/98 |
| 5,406,573 | 4/1995 | Ozbay | 372/43 |
| 5,526,449 | 6/1996 | Meade et al. | 385/14 |
| 5,600,483 | 2/1997 | Fan | 257/17 |

FOREIGN PATENT DOCUMENTS

| | | | |
|---|---|---|---|
| 0442002 | 8/1991 | European Pat. Off. | 257/94 |
| 0442002 A1 | 8/1991 | European Pat. Off. . | |
| 0712181 | 5/1996 | European Pat. Off. . | |

OTHER PUBLICATIONS

Baba et al., Japanese Journal of Applied Physics, "Fabrication and Photoluminescence Studies of GaInAsP/InP 2–Dimensional Photonic Crystals", vol. 35, Part 1, No. 2B, pp. 1348–1352, Feb. 1996.

Gerard et al., Solid–State Electronics, "Photonic Bandgap of Two–Dimensional Dielectric Crystals", vol. 37, No. 4/06, pp. 1341–1344, Aug. 23, 1993.

Gourley et al., Applied Physics Letters, "Optical properties of two–dimensional photonic lattices fabricated as honeycomb nanostructures in compound semiconductors", vol. 64, No. 6, pp. 687–689, Feb. 7, 1994.

Schniter et al. Applied Physics Letters, "Ultrahigh spontaneous emission quantum efficiency, 99.7% internally and 72% externally, from AIGaAs/GaAs/AIGaAs double heterostructures", vol. 62, No. 2, pp. 131–133, Jan. 11, 1993.

Carr et al., One–Watt GaAs p–n Junction Infrared Source, pp. 173–175, Applied Physics Letters, vol. 3, No. 10, 1963.

(List continued on next page.)

*Primary Examiner*—Jerome Jackson
*Attorney, Agent, or Firm*—Samuels, Gauthier & Stevens, LLP

[57] ABSTRACT

A light emitting device comprising a substrate and a dielectric structure having at least a two-dimensionally periodic variation of dielectric constant which exhibits a spectrum of electromagnetic modes including guided modes of frequencies below a predetermined frequency cutoff and radiation modes of frequencies above and below said predetermined frequency cutoff, the two-dimensionally periodic variation of dielectric constant of the dielectric structure introducing a band gap between the guided modes. A radiation source, such as a quantum well, is associated with said structure, and generates electromagnetic radiation which couples to the radiation modes resulting in radiation extraction from the structure. The band gap allows the radiation to couple to radiation modes rather than to guided modes resulting in radiation extraction from the structure. The structure can be fabricated such that a radiation reflector is disposed between the structure and the substrate.

28 Claims, 6 Drawing Sheets

OTHER PUBLICATIONS

Schnitzer et al., "Ultrahigh spontaneous emission quantum efficiency, 99.7% internally and 72% externally, from AlGaAs/GaAs/AlGaAs double heterostructures", pp. 131–133, Applied Physics Letters, vol. 62, No. 2, 1993.

Schnitzer et al., "30% external quantum efficiency from surface textures, thin–film light–emitting diodes", pp. 2174–2176, Applied Physics Letters, vol. 63, No. 16, 1993.

Schubert et al., "Highly Efficient Light–Emitting Diodes with Microcavities", pp. 943–945, Science, vol. 265, 1994.

Meade, et al., "Accurate theoretical analysis of photonic band–gap materials", pp. 8434–8437, Physical Review B, vol. 48, No. 11, 1993.

Kane S. Yee, "Numerical Solution of Initial Boundary Value Problems Involving Maxwell's Equations in Isotropic Media", pp. 302–307, IEEE Transactions of Antennas and Propagation, vol. AP–14, No. 3, 1996.

Gerrit Mur, "Absorbing Boundary Conditions for the Finite–Difference Approximation of the Time–Domain Electromagnetic–Field Equations", pp. 377–382, IEEE Transactions of Electromagnetic Compatibility, vol. EMC–23, No. 4, 1981.

Furse et al., "Why the DFT is Faster Than the FFT for FDTD Time–to–Frequency Domain Conversions", pp. 326–328, IEEE Microwave and Guided Wave Letters, vol. 5, No. 10, 1995.

Meade et al., "Existence of a photonic band gap in two dimensions", pp. 495–497, Applied Physics Letters, vol. 61, No. 4, 1992.

Villeneuve et al., "Photonic band gaps in two–dimensional square and hexagonal lattices", pp. 4969–4972, Physical Review B, vol. 46, No. 8, 1992.

LIGHT EMITTING DEVICE UTILIZING A PERIODIC DIELECTRIC STRUCTURE

This invention was made with government support under Grant Number 9400334-DMR awarded by the National Science Foundation. The government has certain rights in the invention.

BACKGROUND OF THE INVENTION

The invention relates to light emitting devices using periodic dielectric structures.

A very popular conventional light emitting device is the light emitting diode (LED). LEDs are p-n junction devices emitting spontaneous radiation in response to being forward biased. In the past decades, LEDs have come to play a critical role in numerous applications, including illuminations and flat-panel displays and optical communications. Although some conventional LEDs have high internal quantum efficiencies, i.e. high efficiencies of light generation inside the p-n junction, most emitted photons tend to be trapped inside the high refractive index semiconductor medium. As a result, the photons do not escape into free space, which leads to poor extraction efficiencies, typically less than 10%.

In the past thirty years, various approaches have been proposed to enhance the extraction efficiency of LEDs. Most of these techniques seek to enlarge the "escape cone" of photons. Ideally, the escape cone can cover the entire $4\pi$ steradians when a point-like active region is placed in the center of a spherically shaped semiconductor device. This geometry allows light emitted from the active region to be incident on the semiconductor surface at an angle of 90°, resulting in the absence of total internal reflection losses. However, such spherical LEDs are incompatible with today's planar semiconductor technology. More practical geometries employ cubicle, cylinder or epoxy-dome geometries. Details of these structures can be found in E. F. Schubert, "GaAs Light-Emitting Diodes", Properties of GaAs, (INSPEC, Manchester, UK, 1996), incorporated herein by reference. However, none of these structures can entirely eliminate total internal reflection losses. Furthermore, reflection losses exist even for photons radiated inside the escape cone because of the refractive index mismatch between the LED chip and the surrounding media. While such losses could be reduced with an anti-reflection coating, complete cancellation of reflection occurs at only one frequency and one incidence angle.

Other approaches randomize the photon trajectory to enable multiple entry of photons into the escape cone. Trajectory randomization is achieved, for example, with photon recycling, or with surface texturing. As photons have to bounce back and forth several times before eventually entering the escape cone, their lifetimes are long, making these LEDs unsuitable for high-speed applications. Furthermore, as long photon lifetimes tend to increase parasitic losses, it is necessary to use high quality materials.

The conventional structures tend to rely on geometrical optical designs that do not alter the spontaneous emission properties of the devices. The first attempt to increase LED efficiency by direct modification of spontaneous emission was made by putting a quantum well active region in a microcavity defined with a silver reflector and a distributed Bragg reflector, and is described in Schubert et al., "Highly Efficient Light-Emitting Diodes With Microcavities", Science 265, 943 (1994), incorporated herein by reference. At resonance, the spontaneous emission along the axis of the cavity was strongly enhanced, leading to a higher external efficiency. However, off resonance, the emission was actually attenuated. Therefore, these resonant cavity LEDs could not provide enhancement over the entire emission spectrum.

SUMMARY OF THE INVENTION

Accordingly, the invention provides a new device design that solves the problems associated with conventional devices. The invention completely eliminates reflection losses over a very wide range of frequencies, and as no resonance or photon recycling is involved, the photon lifetime is shorter, which has the effect of reducing the absorption loss and increasing the response speed. In particular, the invention utilizes a two-dimensionally periodic photonic-crystal slab to alter the spatial distribution of spontaneous emission. The invention is configured such that nearly all the emitted light can be extracted from such a dielectric geometry.

In accordance with an exemplary embodiment of the invention, there is provided a device comprising a substrate and a dielectric structure having at least a two-dimensionally periodic variation of dielectric constant, and a radiation source incorporated in the structure.

In accordance with another exemplary embodiment of the invention, there is provided a light emitting device comprising a substrate and a dielectric structure having at least a two-dimensionally periodic variation of dielectric constant which exhibits a spectrum of electromagnetic modes including guided modes of frequencies below a predetermined frequency cutoff and radiation modes of frequencies above and below the predetermined frequency cutoff. A radiation source is associated with the structure, and generates electromagnetic radiation which couples to the radiation modes resulting in radiation extraction from the structure.

In accordance with yet another exemplary embodiment of the invention, there is provided a light emitting device comprising a substrate and a dielectric structure having at least a two-dimensionally periodic variation of dielectric constant which exhibits a spectrum of electromagnetic modes including guided modes of frequencies below a predetermined frequency cutoff and radiation modes of frequencies above and below said predetermined frequency cutoff, the two-dimensionally periodic variation of dielectric constant of the dielectric structure introducing a band gap between the guided modes. A radiation source is associated with said structure, and generates electromagnetic radiation which couples to the radiation modes resulting in radiation extraction from the structure. The band gap allows the radiation to couple to radiation modes rather than to guided modes resulting in radiation extraction from the structure.

DETAILED DESCRIPTION OF THE ILLUSTRATED EMBODIMENTS

Figure 1A:
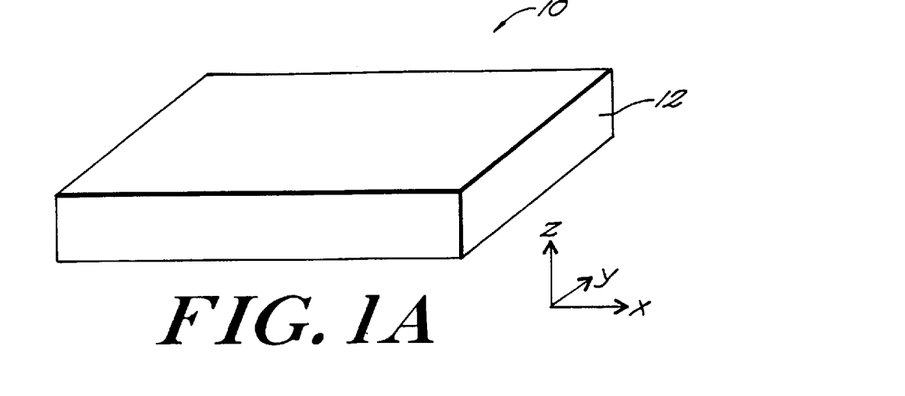
FIG. 1A is a schematic diagram of a simple model for an exemplary LED.

With reference now to FIG. 1, a schematic diagram of a simple model for an exemplary LED 10 is shown. The LED consists of a structure 12 which is a uniform high-index dielectric rectangular slab with a multitude of point dipole radiation sources (not shown) positioned inside the center of the slab. For illustrative purposes, the slab is dimensioned with a thickness 0.5a, where a is an arbitrary length unit lattice constant to be defined hereinafter, and a dielectric constant of 12.096 which corresponds to that of silicon at a wavelength of a 1.55 micrometers. The emitted radiation from the dipole radiation sources will either couple to the guided modes of the dielectric slab or to radiation modes. The guided modes correspond to those frequencies of electromagnetic radiation which are propagated in any direction in the plane of the structure. The radiation modes correspond to those frequencies which are propagated outside the structure.

The dispersion relations of the guided modes are computed using a conjugate gradient plane-wave expansion method as described in Meade et al., "Accurate Theoretical Analysis of Photonic Band-gap Materials", Phys. Rev. B 48, 8434 (1993), incorporated herein by reference. It will be appreciated by those of skill in the art that dielectric structures tend to have both transverse-electric (TE) guided modes and transverse-magnetic (TM) guided modes. TE modes are defined in a uniform dielectric slab as the modes for which the electric field is polarized parallel to the slab. TM modes are defined in a uniform dielectric slab as the modes for which the magnetic field is polarized parallel to the slab. In the case of a non-uniform dielectric slab, the modes are not purely TE or purely TM, but rather quasi-TE or quasi-TM.

Figure 1B:
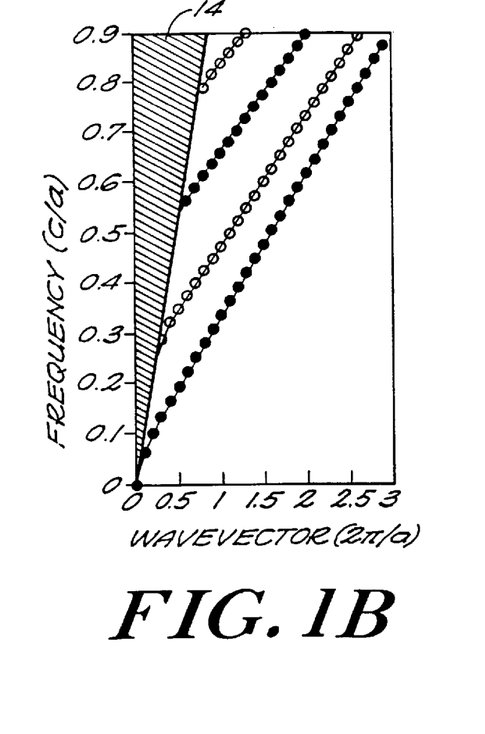
FIG. 1B is a plot of the dispersion relation of the structure shown in FIG. 1A for quasi-TE guided modes.
Figure 1C:
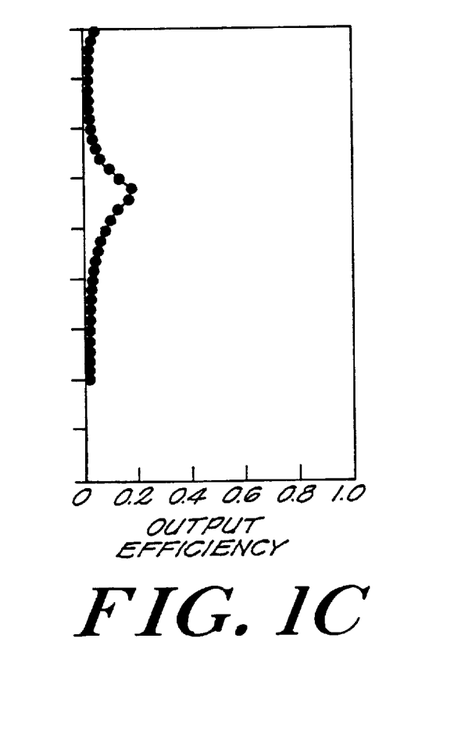
FIG. 1C is a plot of the output efficiency along the z-direction of the structure shown in FIG. 1A as a function of frequency.

FIG. 1B is a plot of the dispersion relation of the structure shown in FIG. 1A for quasi-TE guided modes. The solid circles correspond to guided modes with even symmetry with respect to the x-y plane, while the open circles correspond to guided modes with odd symmetry. FIG. 1C is a plot of the output efficiency along the z-direction as a function of frequency.

The first four TE guided mode bands of the device 10 are plotted in the graph of FIG. 1B. FIG. 1B plots the electromagnetic radiation frequency in units of c/a, where c is the speed of light, versus wavevector in units of $(2\pi/a)$.

These modes are characterized by an electric field lying within and parallel to the structure. The continuum of radiation modes is shown in gray above the light cone 14. Attention is focused on the TE guided modes since light emitted from a quantum well sandwiched between two dielectric layers would have a similar polarization.

The extraction efficiency is defined as the fraction of emitted flux through the top and bottom surfaces of the structure to the total emitted flux. In general, it is expected that the extraction efficiency will increase with the density of radiation modes, and decrease with the density of guided modes. To calculate the efficiency, a three-dimensional finite-difference time-domain method is used as described in K. S. Yee, "Numerical Solutions of Initial Boundary Value Problems Involving Maxwell's Equations in Isotropic Media", IEEE Trans. Antennas Propagat., AP-14, 302 (1966), and G. Mur, "Absorbing Boundary Conditions for the Finite-difference Time-domain Approximation of the Time-domain Electromagnetic Field Equations", IEEE Trans. Electromagn. Compat. EMC-23, 377 (1981), both incorporated herein by reference. A point dipole radiation source polarized in the xy-plane is inserted at the center of the dielectric structure, and is excited with a gaussian profile in time. The extraction efficiency is shown in FIG. 1C as a function of frequency. The results are obtained by a discrete Fourier transform which allows for the computation of the efficiency at different frequencies in a single simulation run, as described in Furse et al., "Why the DFT is Faster Than the FFT for FDTD Time-to-frequency Domain Conversions", IEEE Microwave and Guided Wave Lett. 5, 326 (1995), incorporated herein by reference.

The extraction efficiency is for the most part well below 10%. At low frequencies, the density of radiation modes increases more rapidly than that of the single guided mode. Consequently, the extraction efficiency initially increases with frequency, eventually reaching a maximum of 19% at 0.58c/a. The drop in efficiency above 0.58c/a arises from the appearance of an additional guided mode which "traps" the emitted radiation and hinders light extraction from the structure. A similar drop is not observed at the cut-off frequency of the second band in FIG. 1B since the dipole radiation source cannot couple to bands with odd symmetry.

The existence of guided modes in the structure 12 impedes the extraction of light. In the case shown in FIG. 1B where the structure is surrounded by air, guided modes exist at every frequency. In the case where the structure lies on a substrate, the first guided-mode band has a non-zero cut-off frequency. The emitted radiation below the cut-off is almost entirely funneled into the substrate.

By introducing a strong two-dimensional variation of the refractive index into the exemplary structure (without substrate), a frequency range is created for which no guided modes can exist. In this frequency range, all the spontaneously emitted power will couple to free space modes and will radiate out of the structure.

Figure 2A:
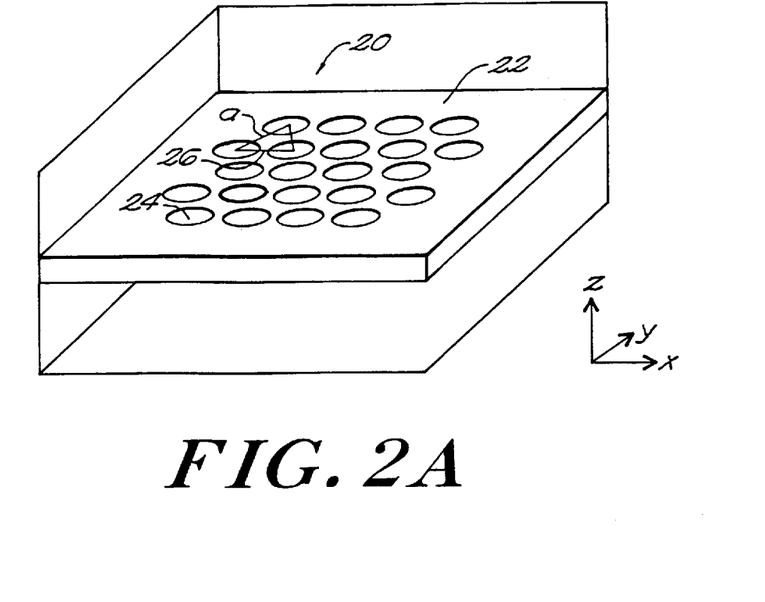
FIG. 2A is a schematic diagram of an exemplary embodiment of a light emitting device in accordance with the invention.

FIG. 2A is a schematic diagram of an exemplary embodiment of a light emitting device 20 in accordance with the invention. The device includes a structure 22 configured from a rectangular slab of dielectric material, with a point dipole radiation source (not shown) positioned inside the center of the slab. A refractive index variation is introduced to the structure in order to create a dielectric structure having a two-dimensionally periodic variation of dielectric constant. A two-dimensional periodic dielectric structure is a structure which exhibits a periodic spatial variation in dielectric constant in two-dimensions within the structure. Specifically, the structure 20 is periodic in the x and y directions.

The periodic variation in the exemplary embodiment is achieved by patterning a triangular or hexagonal lattice 26 of elements 24 into the dielectric slab. The exemplary embodiment will be described with the elements 24 being cylindrical air holes. The elements are chosen to have a diameter of 0.45a, where a is the lattice constant of the triangular array. Other possible lattice arrangements include square lattice and honeycomb lattice.

It will be appreciated that quasi-cylindrical elements or other shaped elongated elements can be employed. The elements can be formed of a non-conductive low-dielectric material disposed within a non-conductive high-dielectric substrate material. The elements can simply be bores, voids or channels which are filled with air and/or other liquid or solid material.

The triangular lattice is a natural choice since, in the case of a slab with infinite thickness, a large in-plane band gap appears for both TE and TM polarizations, as described in Meade et al., "Existence of a Photonic Band Gap in Two Dimensions", Appl. Phys. Lett. 61, 495 (1992) and Villeneuve et al., "Photonic Band Gaps in Two-dimensional Square and Hexagonal Lattices", Phys. Rev. B 46, 4969 (1992), both of which are incorporated herein by reference. The band gap of a periodic dielectric structure is a band of frequencies of electromagnetic radiation which cannot propagate through the structure in the plane in which the structure exhibits periodic variation in dielectric constant.

Figure 2B:
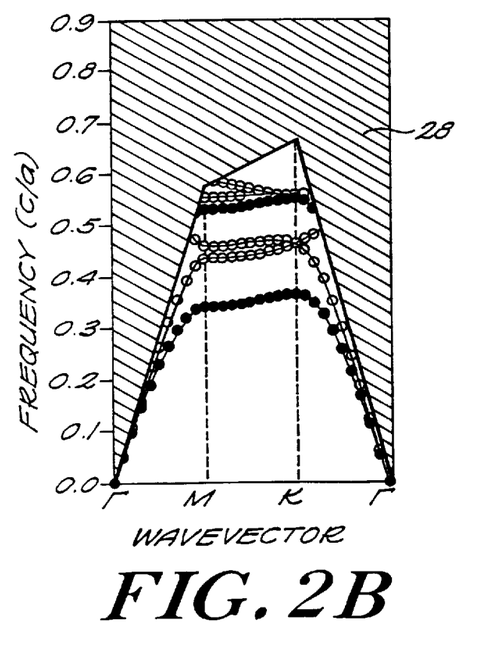
FIG. 2B is a plot of the dispersion relation of the structure shown in FIG. 2A.
Figure 2C:
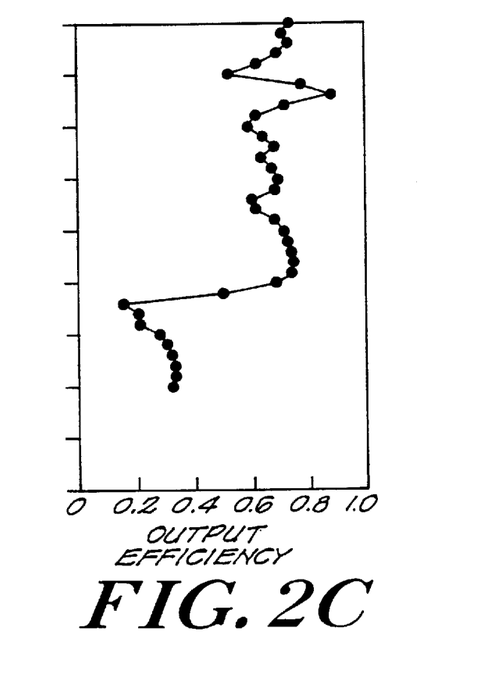
FIG. 2C is a plot of the output efficiency as a function of frequency for the structure shown in FIG. 2A;.

FIG. 2B is a plot of the dispersion relation of the structure shown in FIG. 2A for the case of an infinite number of air holes. The photonic band diagram of the device 20 shows a graph of radiation frequency versus wavevector. The gray area corresponds to the continuum of extended (non-guided) or radiation modes. The solid circles correspond to TE-like guided modes. FIG. 2C is a plot of the output efficiency as a function of frequency for the structure shown in FIG. 2A.

The periodicity of the structure has a dual effect on the guided modes: it opens a band gap, and also sets an upper frequency limit or cut-off. A gap can be seen between the first and second quasi-TE bands, and between the second and third quasi-TM bands. The gap for the quasi-TE modes extends from 0.37c/a to 0.53c/a (gap size of 36%, which is defined as the gap width over the midgap frequency), while the gap for the quasi-TM modes extends from 0.47c/a to 0.56c/a (gap size of 17%). Additional gaps can be seen between the second quasi-TE band at 0.55c/a and a cut-off frequency at 0.66c/a, and between the fourth TM band at 0.59c/a and the cut-off frequency at 0.66c/a. Above 0.66c/a, all of the modes are extended. The periodicity causes every mode above the cut-off to be Bragg scattered into the continuum.

The extraction efficiency is studied by using the exemplary embodiment shown in FIG. 2A. The dipole radiation source (not shown) is located at the center of the slab, and is aligned along the y-direction. Only quasi-TE modes will be able to couple to the emitted radiation. The computational results of the output efficiency are plotted in FIG. 2C. At the bandedge of the lowest band, the extraction efficiency jumps sharply from less than 15% to more than 70%. The efficiency remains close to 70% inside the entire gap region. A dip occurs at approximately 0.55c/a, which coincides with the upper edge of the gap. Above the second band, there are no quasi-TE guided modes. The efficiency oscillates around an average value of 70% with the occasional peak close to 90%.

Figure 3A:
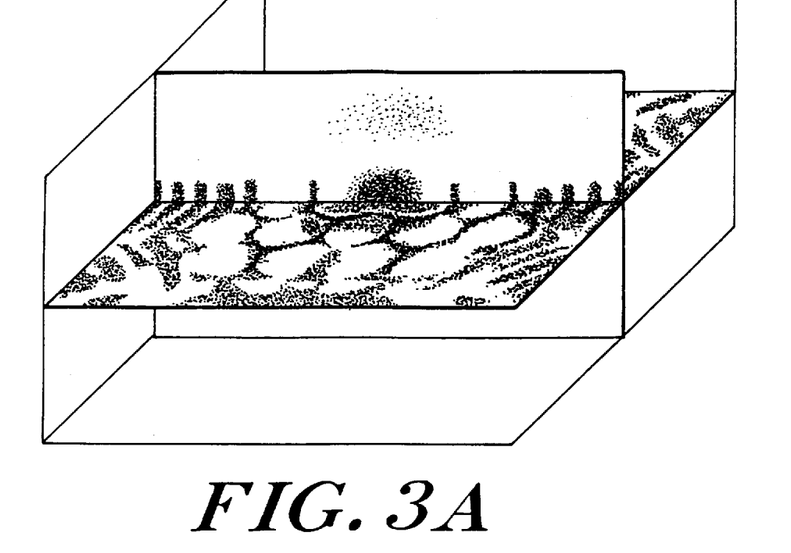
FIGS. 3A and 3B are experimental plots of the spatial distribution of the electric-field power-density radiating from the dipole radiation source of the device shown in FIG. 2A.
Figure 3B:
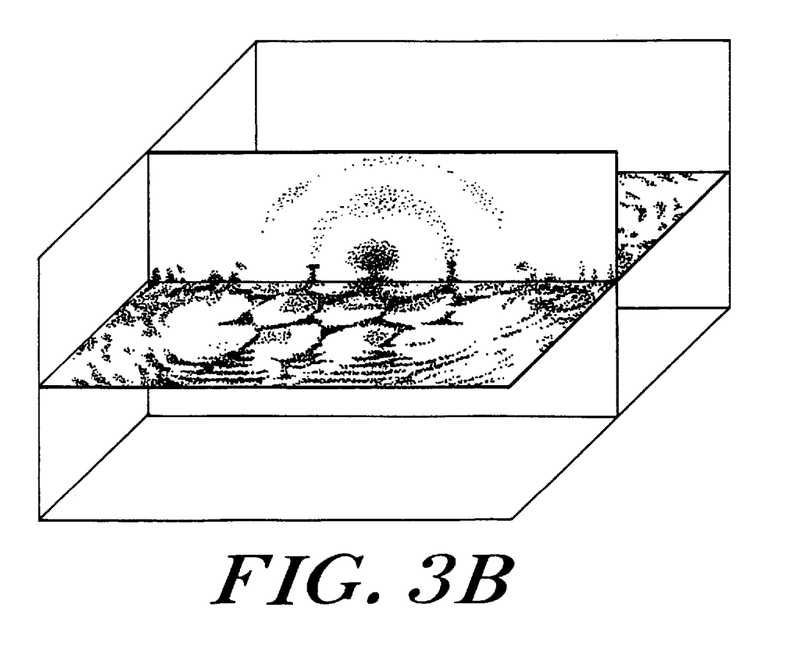

FIGS. 3A and 3B are computational plots of the spatial distribution of the electric-field power-density radiating from the dipole radiation source of the device 20. The power is shown for two different frequencies. FIG. 3A corresponds to frequency 0.44c/a, which lies inside the gap, and FIG. 3B corresponds to frequency 0.76c/a, which falls inside the continuum of extended modes. In both cases, a large fraction of the power is radiated into free space, as expected.

Although both cases display large extraction efficiencies, the radiation patterns reveal important differences. In the case shown in FIG. 3A, radiation appears to originate predominantly from the center of the array, while in FIG. 3B the radiation appears to be more spread out. This difference is attributed to the nature of the eigenmodes in the absence of the dipole. Modes inside the gap do not propagate along the structure, thus emitted light goes directly into free space. On the other hand, modes above the light line possess large components in both the structure and free space. Emitted light, therefore, can propagate along the structure and then couple out to radiation modes, resulting in a more complex radiation pattern.

As is shown in accordance with FIGS. 2A–2C, light can be extracted from a dielectric structure with high efficiency using less than three periods of the triangular array in any direction around a dipole radiation source. Since only a finite number of holes is introduced into the structure, some radiation is able to escape along the structure. The radiation intensity decays away from the source, up the edge of the array, and couples to guided modes and remains trapped inside the structure. By increasing the number of holes, even higher extraction efficiencies will be achieved.

Figure 4A:
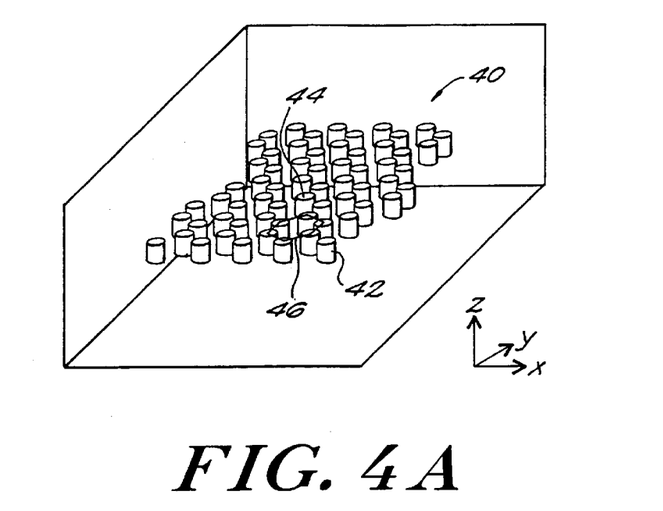
FIG. 4A is a schematic diagram of an alternative exemplary embodiment of a light emitting device in accordance with the invention.

FIG. 4A is a schematic diagram of an alternative exemplary embodiment of a light emitting device 40 in accordance with the invention. The device includes a structure of cylindrical posts or rods 42 of dielectric material, with a point dipole radiation source (not shown) positioned at the center of a center of a rod 44. A refractive index variation is thus introduced to the structure in order to create a dielectric structure having a two-dimensionally periodic variation of dielectric constant.

The rods 42 can be formed of non-conductive high-dielectric material disposed in the periodic arrangement in a non-conductive low-dielectric material. An example of this configuration is a high-dielectric substrate with material etched away to leave only the periodic arrangement of rods of the high-dielectric material with air in the spaces between the rods. The space can also be filled with some other low-dielectric fluid or solid.

The device 40 is analogous to the device 20 described above, except that where there was a dielectric now there is air, and vice versa. The posts 42 have a radius of 0.15a, a height of 0.5a, a dielectric constant of 12.096, and are arranged in a honeycomb lattice 46. Other possible lattice arrangements include square lattice and triangular lattice.

As was the case for the triangular lattice of air holes with respect to the device 20, the honeycomb lattice of dielectric posts generates a complete in-plane band gap for both polarizations when the posts have infinite length, as is clarified in greater detail in Joannopoulos et al., *Photonic Crystals, Molding the Flow of Light*, (Princeton University Press, Princeton, 1995), incorporated herein by reference. However, it turns out that the band gap lies above the cut-off frequency for the guided modes, i.e. above the light line in the light cone 48.

Figure 4B:
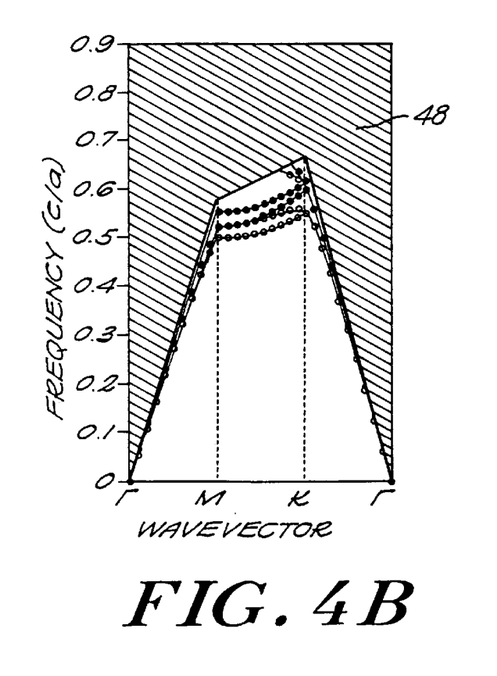
FIG. 4B is a plot of the dispersion relation of the structure shown in FIG. 4A.
Figure 4C:
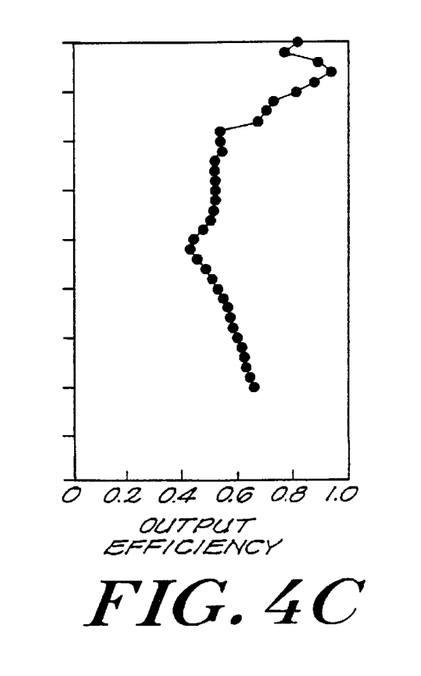
FIG. 4C is a plot of the output efficiency as a function of frequency for the structure shown in FIG. 4A.

FIG. 4B is a plot of the dispersion relation of the structure shown in FIG. 4A for the case of an infinite number of posts. The gray area corresponds to the continuum of extended (non-guided) modes. The solid circles correspond to quasi-TE guided modes, while the open circles correspond to quasi-TM guided modes. FIG. 4C is a plot of the output efficiency as a function of frequency, for the structure shown in FIG. 4A.

The band structure is shown in FIG. 4B, which shows a graph of radiation frequency versus wavevector, for the case of rods with finite length. There is no gap for the guided modes in the device 40. The computational output efficiency of device 40 is plotted in FIG. 4C. As expected, there is no spectral region with high extraction efficiency below the light cone 48. Above the light cone, however, the efficiency jumps above 80%, with a peak at 94%.

Accordingly, the exemplary embodiments of the invention which include devices 20 and 40 present device designs for light-emitting diodes that can yield extraction efficiencies approaching 100%. The designs solve the long-standing problem of poor light extraction from high refractive-index semiconductors in light-emitting diodes.

A light emitting device having a two-dimensionally periodic dielectric structure as shown in FIGS. 2A and 4A can be fabricated on a portion of a homogeneous or uniform substrate by one of several methods. One method involves drilling holes. The holes are filled with a low-dielectric material such as air.

One exemplary method involves the use of reactive-ion etching. The substrate is covered on one face with a mask which contains a two-dimensional array of geometric figures of the size, spacing and periodicity required for the desired band gap. This two-dimensional array of geometric figures may be patterned by employing electron beam lithography or conventional photolithography. The geometric figures are either transparent or opaque to a reactive-ion etchant used to selectively eradicate the high dielectric substrate material. For example, if cylindrical air channels are to be formed in the substrate, the geometric figures are circles which are transparent to the etchant, and the remainder of the mask is opaque to the etchant. If square rods of high dielectric material are to be formed, the figures are squares which are opaque to the etchant, and the reminder of the mask is a transparent to the etchant.

The substrate and mask are then exposed to the highly directional reactive-ion etchant. The reactive-ion plasma is directed at the mask along the perpendicular axis, and vertical channels of the desired shape are created in the substrate. The resulting array of elements defines the two-dimensional periodicity of the structure.

Figure 5:
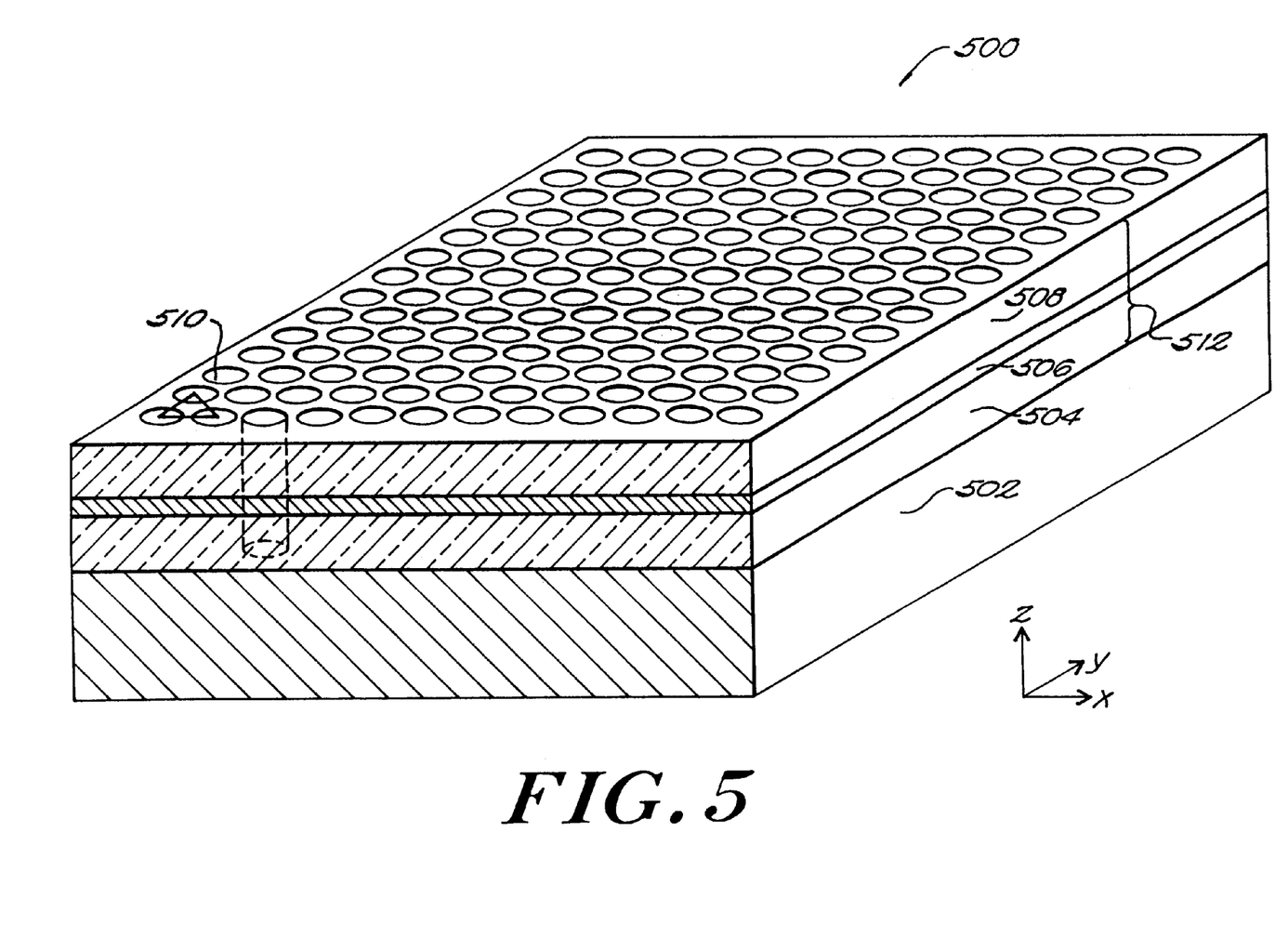
FIG. 5 is a schematic perspective view of an integrated light emitting device in accordance with an exemplary embodiment of the invention.

FIG. 5 is a schematic perspective view of an integrated light emitting device 500 in accordance with an exemplary embodiment of the invention. The device 500 comprises a substrate 502 formed of a material having a relatively high refractive index such as n-type GaAs. An epilayer 504 made of a dielectric material having a relatively high refractive index such as n-type GaAs is formed on the top surface of the substrate. The forming of this and subsequent layers is done by epitaxial growth or other similar fabrication techniques. A stratum 506 is formed on the top surface of the epilayer 504. The stratum 506 is made of an ultrathin layer of undoped AlGaAs or alternating thin layers of undoped AlGaAs and ultrathin layers of undoped GaAs. Another layer 508 of dielectric material having a relatively high refractive index such as p-type GaAs, is formed on the top surface of the stratum 506 to complete the device 500. Accordingly, the stratum 506 defines a quantum well or multiquantum-wells which are sandwiched between two dielectric layers. The stratum 506 thus serves as the electromagnetic radiation source when the layers 504 and 508 are oppositely biased in a conventional manner.

A quantum well is a double heterojunction structure consisting of an ultrathin layer of semiconductor material whose band gap is smaller than that of the surrounding material. The sandwich forms conduction- and valence-band potential wells within which electrons and holes are confined, respectively. The alternative embodiment of alternating layers of ultrathin GaAs and thin AlGaAs define a multiquantum-well structure.

The layers 504, 508 and stratum 506 are configured with a periodic pattern of elements 510, shown in the illustrated embodiment as holes or channels positioned in a triangular lattice, by one of the methods previously described. The elements 510 can be holes which are filled with low-dielectric fluids, such as air, or solid material. Accordingly, the elements 510 introduce a two-dimensionally periodic variation in dielectric constant to define a two-dimensionally periodic dielectric structure 512.

Figure 6:
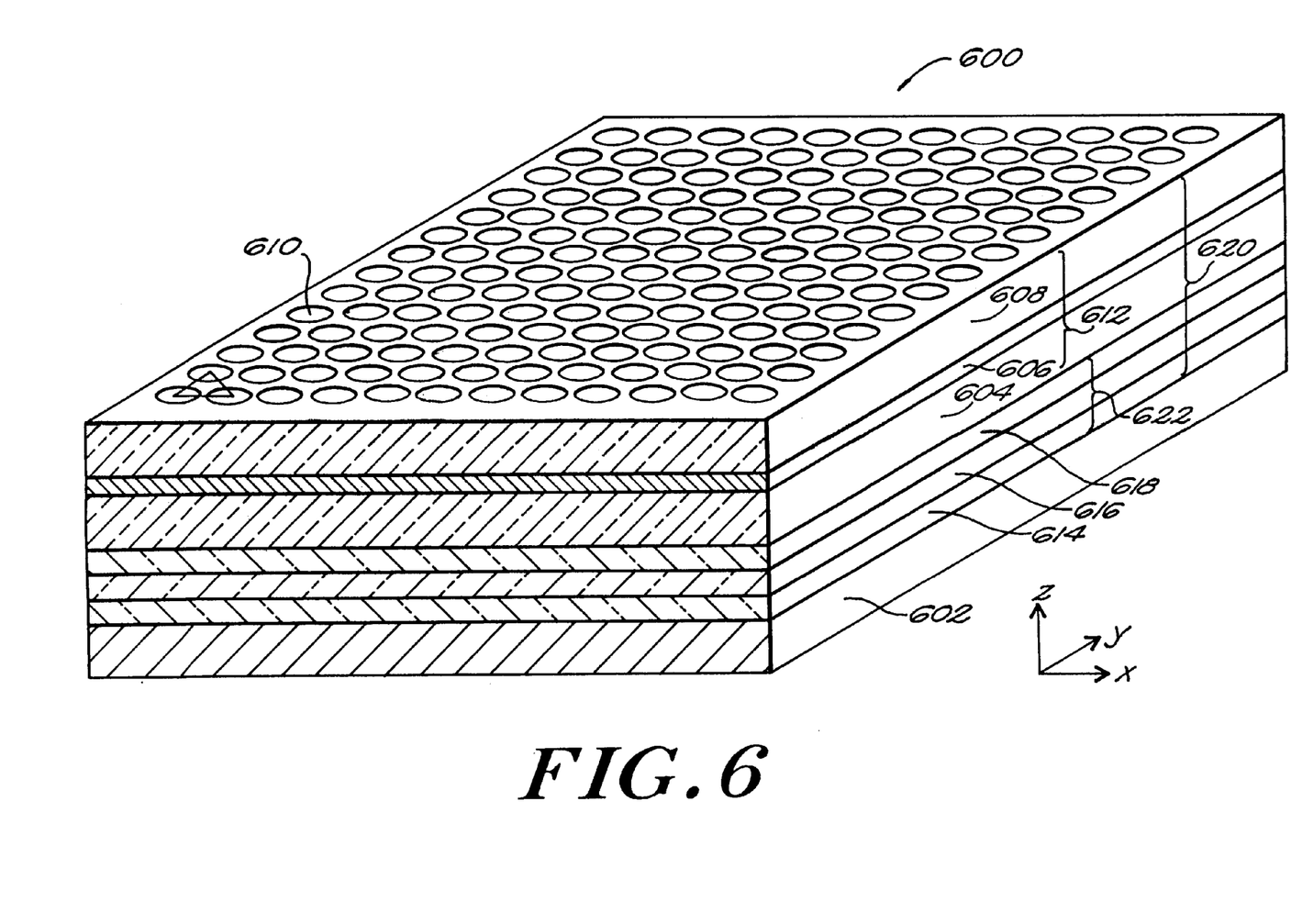
FIG. 6 is a schematic perspective view of an integrated light emitting device in accordance with an alternative exemplary embodiment of the invention.

FIG. 6 is a schematic perspective view of an integrated light emitting device 600 in accordance with another exemplary embodiment of the invention. The device 600 comprises a substrate 602 formed of a material having a relatively high refractive index such as n-type GaAs. A series of epilayers 614, 616 and 618 made of n-type materials of alternating and/or differing relatively low refractive indices are formed on the top surface of the substrate 602 to define a radiation reflector 622. The layers can be alternating layers of n-type AlAs and n-type GaAs or alternating layers of n-type AlGaAs. While only three layers are illustrated, it will be understood that any plurality of layers, e.g. 12 will define a useful reflector.

Thereafter, and in accordance with the fabrication method described with reference to FIG. 5, a two-dimensionally periodic dielectric structure 612 is formed on top of the layer 618. The structure 612 comprises respective n-type and p-type dielectric layers 604 and 608, which sandwich an undoped quantum well stratum 606. The quantum well stratum serves as the radiation source for the device 600 as previously described.

The combination of the epilayers 614, 616 and 618 and the structure 612 form a structure 620 which has a three-dimensional variation in dielectric constant. The epilayers 614, 616 and 618 define a Bragg mirror 622, which reflects radiation that is emitted in the direction of the substrate 602 back into the structure 612. The Bragg mirror serves to increase the extraction efficiency of the device 600 along the upward vertical direction.

In alternative embodiments, the structure 612 can be formed on a simple reflective layer of material such as silver deposited on the top surface of the substrate 602. In addition, a radiation reflector can be configured with a single layer of dielectric material which has a relatively low refractive index and/or is provided with elements such as air channels which extend along both the x and y axes.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A light emitting device comprising:
a substrate;
a dielectric structure having at least a two-dimensionally periodic variation of dielectric constant which exhibits a spectrum of electromagnetic modes including guided modes of frequencies below a predetermined frequency cutoff and radiation modes of frequencies above and below said predetermined frequency cutoff; and a radiation source associated with said structure, said radiation source generating electromagnetic radiation of frequencies above said predetermined frequency cutoff which couples to radiation modes of frequencies above said predetermined frequency cutoff resulting in radiation extraction from said structure.

2. The device of claim 1, wherein said dielectric structure comprises at least one layer of dielectric material having a periodic pattern of elements associated therewith, said elements comprising material having a dielectric constant which differs from that of said layer.

3. The device of claim 2, wherein said elements comprise channels through said layer which are filled with a fluid or solid material.

4. The device of claim 1, wherein said dielectric structure comprises a periodic pattern of elements of material, said elements being surrounded by another material having a dielectric constant which differs from that of said elements.

5. The device of claim 4, wherein said elements comprise rods extending from said substrate.

6. The device of claim 1, wherein said radiation source comprises a plurality of point dipole sources.

7. The device of claim 1, wherein said dielectric structure comprises two layers of dielectric material having a periodic pattern of elements associated therewith, said elements comprising material having a dielectric constant which differs from that of said layer.

8. The device of claim 7, wherein said radiation source comprises a quantum well stratum disposed between said two layers of dielectric material.

9. The device of claim 2, wherein said elements comprise channels through said two layers of dielectric material which are filled with a fluid or solid material.

10. The device of claim 1 further comprising a radiation reflector disposed between said structure and said substrate.

11. The device of claim 10, wherein said radiation reflector comprises a layer of reflective material.

12. The device of claim 10, wherein said radiation reflector comprises a plurality of periodically varying dielectric layers disposed between said structure and said substrate, said device having a three-dimensionally periodic variation of dielectric constant.

13. The device of claim 1, wherein said radiation source comprises a quantum well stratum disposed within said structure.

14. A light emitting device comprising:

a substrate;

a dielectric structure having at least a two-dimensionally periodic variation of dielectric constant which exhibits a spectrum of electromagnetic modes including guided modes of frequencies below a predetermined frequency cutoff and radiation modes of frequencies above and below said predetermined frequency cutoff, said two-dimensionally periodic variation of dielectric constant of said dielectric structure introducing a band gap between said guided modes; and a radiation source associated with said structure, said radiation source generating electromagnetic radiation which couples to said radiation modes resulting in radiation extraction from said structure, wherein said band gap allows said radiation to couple to radiation modes rather than to guided modes resulting in radiation extraction from said structure.

15. The device of claim 14, wherein said dielectric structure comprises at least one layer of dielectric material having a periodic pattern of elements associated therewith, said elements comprising material having a dielectric constant which differs from that of said layer.

16. The device of claim 15, wherein said elements comprise channels through said layer which are filled with a fluid or solid material.

17. The device of claim 14, wherein said dielectric structure comprises a periodic pattern of elements of material, said elements being surrounded by another material having a dielectric constant which differs from that of said elements.

18. The device of claim 17, wherein said elements comprise rods extending from said substrate.

19. The device of claim 14, wherein said radiation source comprises a plurality of point dipole sources.

20. The device of claim 14, wherein said dielectric structure comprises two layers of dielectric material having a periodic pattern of elements associated therewith, said elements comprising material having a dielectric constant which differs from that of said layer.

21. The device of claim 20, wherein said radiation source comprises a quantum well stratum disposed between said two layers of dielectric material.

22. The device of claim 15, wherein said elements comprise channels through said two layers of dielectric material which are filled with a fluid or solid material.

23. The device of claim 14 further comprising a radiation reflector disposed between said structure and said substrate.

24. The device of claim 23, wherein said radiation reflector comprises a layer of reflective material.

25. The device of claim 23, wherein said radiation reflector comprises a plurality of periodically varying dielectric layers disposed between said structure and said substrate, said device having a three-dimensionally periodic variation of dielectric constant.

26. The device of claim 24, wherein said radiation source comprises a quantum well stratum disposed within said structure.

27. A light emitting device comprising:

a substrate;

a dielectric structure having at least a two-dimensional variation of dielectric constant which exhibits a spectrum of electromagnetic modes including guided modes of frequencies below a predetermined frequency cutoff and radiation modes of frequencies above and below said predetermined frequency cutoff; and a radiation source associated with said structure, said radiation source generating electromagnetic radiation of frequencies above said predetermined frequency cutoff which couples to radiation modes of frequencies above said predetermined frequency cutoff resulting in radiation extraction from said structure.

28. A light emitting device comprising:

a substrate;

a dielectric structure having at least a two-dimensional variation of dielectric constant which exhibits a spectrum of electromagnetic modes including guided modes and radiation modes, said two-dimensional variation of dielectric constant of said dielectric structure introducing a gap between said guided modes; and a radiation source associated with said structure, said radiation source generating electromagnetic radiation which couples to said radiation modes resulting in radiation extraction from said structure, wherein said gap allows said radiation to couple to radiation modes rather than to guided modes resulting in radiation extraction from said structure.

* * * * *